(12) United States Patent
Morgan (10) Patent No.: US 8,885,995 B2
(45) Date of Patent: Nov. 11, 2014

(54) LIGHT-GUIDE SOLAR ENERGY CONCENTRATOR

(75) Inventor: John Paul Morgan, Toronto (CA)

(73) Assignee: Morgan Solar Inc., Toronto, Ontario (CA)

( * ) Notice: Subject to any disclaimer, the term of this patent is extended or adjusted under 35 U.S.C. 154(b) by 459 days.

(21) Appl. No.: 13/366,760

(22) Filed: Feb. 6, 2012

(65) Prior Publication Data

US 2012/0140352 A1    Jun. 7, 2012

Related U.S. Application Data

(60) Provisional application No. 61/439,984, filed on Feb. 7, 2011.

(51) Int. Cl.

| | | |
|---|---|---|
| *F24J 2/08* | (2006.01) | |
| *H01L 31/052* | (2014.01) | |
| *F24J 2/18* | (2006.01) | |
| *F24J 2/10* | (2006.01) | |
| *F21V 8/00* | (2006.01) | |

(52) U.S. Cl.
CPC ............ *H01L 31/0525* (2013.01); *Y02E 10/52* (2013.01); *F24J 2/08* (2013.01); *Y02E 10/40* (2013.01); *G02B 6/005* (2013.01); *G02B 6/0038* (2013.01); *F24J 2/18* (2013.01); *F24J 2/10* (2013.01)
USPC .......................................................... 385/33

(58) Field of Classification Search
CPC ............... F24J 2/08; F24J 2/062; F24J 2/067; F24J 2/085; H01L 31/0524; H01L 31/0525; H01L 31/0527
USPC .......................................................... 385/33
See application file for complete search history.

(56) References Cited

U.S. PATENT DOCUMENTS

| 4,037,096 A | 7/1977 | Brendgord et al. |
|---|---|---|
| 4,074,704 A | 2/1978 | Gellert |

(Continued)

FOREIGN PATENT DOCUMENTS

| DE | 19937448 A1 | 2/2001 |
|---|---|---|
| EP | 1895228 A1 | 3/2008 |

(Continued)

OTHER PUBLICATIONS

Supplementary Search Report of EP 08748249; Sep. 16, 2011; Marc Ley. (Illumination Parent Non-Patent Literature, pp. 1-13).

(Continued)

*Primary Examiner* — Tina Wong
*Assistant Examiner* — Chad Smith
(74) *Attorney, Agent, or Firm* — Dimock Stratton LLP (57) ABSTRACT

A light-guide solar concentrator that requires less precision to assemble and manufacture than some other two-layer solar concentrators has a light-condensing layer and an optical waveguide layer. The light-condensing layer includes a plurality of focusing elements for focusing incident sunlight and a plurality of corresponding collimating elements for collimating the light for output to the optical waveguide layer. The optical waveguide layer receives the collimated light and has a plurality of deflectors for redirecting the light for lateral transmission through the optical waveguide layer toward an exit surface. A secondary optic optically coupled to the exit surface can also be provided to redirect the light toward a light collection area where a solar energy collector can be placed to harvest the concentrated sunlight.

19 Claims, 9 Drawing Sheets

(56) References Cited

U.S. PATENT DOCUMENTS

| | | |
|---|---|---|
| 4,151,582 A | 4/1979 | Grunberger |
| 4,199,376 A | 4/1980 | Sill |
| 4,252,416 A | 2/1981 | Jaccard |
| 4,257,401 A | 3/1981 | Daniels |
| 4,282,862 A | 8/1981 | Soleau |
| 4,344,417 A | 8/1982 | Malecek |
| 4,379,613 A | 4/1983 | Coburn |
| 4,389,698 A | 6/1983 | Cibie |
| 4,411,490 A | 10/1983 | Daniel |
| 4,432,039 A | 2/1984 | Cibie |
| 4,496,211 A | 1/1985 | Daniel |
| 4,529,830 A | 7/1985 | Daniel |
| 4,539,625 A | 9/1985 | Bornstein et al. |
| 4,691,994 A | 9/1987 | Afian et al. |
| 4,697,867 A | 10/1987 | Blanc et al. |
| 4,798,448 A | 1/1989 | Van Raalte |
| 4,863,224 A | 9/1989 | Afian et al. |
| 4,954,930 A | 9/1990 | Maegawa et al. |
| 5,050,946 A | 9/1991 | Hathaway |
| 5,089,055 A | 2/1992 | Nakamura |
| 5,136,480 A | 8/1992 | Pristash et al. |
| 5,197,792 A | 3/1993 | Jiao et al. |
| 5,202,950 A | 4/1993 | Arego et al. |
| 5,220,462 A | 6/1993 | Feldman, Jr. |
| 5,357,592 A | 10/1994 | Neilson |
| 5,385,615 A | 1/1995 | Horne |
| 5,390,085 A | 2/1995 | Mari-Roca et al. |
| 5,396,350 A | 3/1995 | Beeson et al. |
| 5,438,485 A | 8/1995 | Li et al. |
| 5,485,291 A | 1/1996 | Qiao et al. |
| 5,485,354 A | 1/1996 | Ciupke et al. |
| 5,521,725 A | 5/1996 | Beeson et al. |
| 5,528,720 A | 6/1996 | Winston et al. |
| 5,540,216 A | 7/1996 | Rasmusson |
| 5,598,280 A | 1/1997 | Nishio et al. |
| 5,664,862 A | 9/1997 | Redmond et al. |
| 5,719,649 A | 2/1998 | Shono et al. |
| 5,806,955 A | 9/1998 | Parkyn, Jr. et al. |
| 5,838,403 A | 11/1998 | Jannson et al. |
| 5,839,812 A | 11/1998 | Ge et al. |
| 5,877,874 A | 3/1999 | Rosenberg |
| 5,914,760 A | 6/1999 | Daiku |
| 5,926,601 A | 7/1999 | Tai et al. |
| 5,977,478 A | 11/1999 | Hibino et al. |
| 6,011,602 A | 1/2000 | Miyashita et al. |
| 6,036,340 A | 3/2000 | Fohl et al. |
| 6,072,551 A | 6/2000 | Jannson et al. |
| 6,097,549 A | 8/2000 | Jenkins et al. |
| 6,108,059 A | 8/2000 | Yang |
| 6,129,439 A | 10/2000 | Hou et al. |
| 6,139,176 A | 10/2000 | Hulse et al. |
| 6,193,383 B1 | 2/2001 | Onikiri et al. |
| 6,201,246 B1 | 3/2001 | Potekev et al. |
| 6,224,223 B1 | 5/2001 | Higuchi et al. |
| 6,294,723 B2 | 9/2001 | Uematsu et al. |
| 6,367,941 B2 | 4/2002 | Lea et al. |
| 6,379,016 B1 | 4/2002 | Boyd et al. |
| 6,425,391 B1 | 7/2002 | Davoren et al. |
| 6,461,007 B1 | 10/2002 | Akaoka |
| 6,473,554 B1 | 10/2002 | Pelka et al. |
| 6,541,694 B2 | 4/2003 | Winston et al. |
| 6,570,710 B1 | 5/2003 | Nilsen et al. |
| 6,576,887 B2 | 6/2003 | Whitney et al. |
| 6,607,286 B2 | 8/2003 | West et al. |
| 6,612,709 B2 | 9/2003 | Yamada et al. |
| 6,623,132 B2 | 9/2003 | Lekson et al. |
| 6,639,733 B2 | 10/2003 | Minano et al. |
| 6,647,199 B1 | 11/2003 | Pelka et al. |
| 6,730,840 B2 | 5/2004 | Sasaoka et al. |
| 6,804,062 B2 | 10/2004 | Atwater et al. |
| 6,811,277 B2 | 11/2004 | Amano |
| 6,819,687 B1 | 11/2004 | Fein |
| 6,899,443 B2 | 5/2005 | Rizkin et al. |
| 6,966,661 B2 | 11/2005 | Read |
| 6,991,357 B2 | 1/2006 | Wimbert et al. |
| 7,020,364 B2 | 3/2006 | Ghiron et al. |
| 7,021,805 B2 | 4/2006 | Amano et al. |
| 7,046,907 B2 | 5/2006 | Miyashita |
| 7,083,313 B2 | 8/2006 | Smith |
| 7,134,778 B2 | 11/2006 | Kazuhiro et al. |
| 7,160,010 B1 | 1/2007 | Chinniah et al. |
| 7,309,154 B2 | 12/2007 | Ohkawa |
| 7,347,611 B2 | 3/2008 | Kwon |
| 7,371,001 B2 | 5/2008 | Miyashita |
| 7,438,454 B2 | 10/2008 | Chinniah et al. |
| 7,467,879 B2 | 12/2008 | Herloski et al. |
| 7,548,670 B2 | 6/2009 | Ijzerman et al. |
| 7,581,867 B2 | 9/2009 | Lee et al. |
| 7,614,768 B2 | 11/2009 | Stanitzok et al. |
| 7,664,350 B2 | 2/2010 | Ghosh et al. |
| 7,672,549 B2 | 3/2010 | Ghosh et al. |
| 7,808,577 B2 | 10/2010 | Kimura |
| 7,925,129 B2 | 4/2011 | Ghosh et al. |
| 7,970,246 B2 | 6/2011 | Travis et al. |
| 7,994,529 B2 | 8/2011 | Bierhuizen et al. |
| 8,152,339 B2 | 4/2012 | Morgan |
| 2003/0063474 A1 | 4/2003 | Coushaine |
| 2003/0067760 A1 | 4/2003 | Jagt et al. |
| 2003/0075167 A1 | 4/2003 | Minano Dominguez et al. |
| 2003/0075212 A1 | 4/2003 | Chen |
| 2003/0198436 A1 | 10/2003 | Kaneko |
| 2004/0096158 A1 | 5/2004 | Yoneda |
| 2004/0103938 A1 | 6/2004 | Rider |
| 2004/0120157 A1 | 6/2004 | Bottesch et al. |
| 2005/0111235 A1 | 5/2005 | Suzuki et al. |
| 2005/0129358 A1 | 6/2005 | Minano et al. |
| 2005/0213344 A1 | 9/2005 | Inamoto |
| 2005/0243570 A1 | 11/2005 | Chaves et al. |
| 2005/0254259 A1 | 11/2005 | Yamashita et al. |
| 2006/0072222 A1 | 4/2006 | Lichy |
| 2006/0077692 A1 | 4/2006 | Noh et al. |
| 2006/0098929 A1 | 5/2006 | Steenblik et al. |
| 2006/0207650 A1 | 9/2006 | Winston et al. |
| 2006/0269213 A1 | 11/2006 | Hwang et al. |
| 2007/0047260 A1 | 3/2007 | Lee et al. |
| 2007/0095386 A1 | 5/2007 | Gibson |
| 2007/0171418 A1 | 7/2007 | Nyhart, Jr. |
| 2007/0236927 A1 | 10/2007 | Liu |
| 2007/0246040 A1 | 10/2007 | Schaafsma |
| 2007/0251568 A1 | 11/2007 | Maeda |
| 2008/0048102 A1 | 2/2008 | Kurtz et al. |
| 2008/0087323 A1 | 4/2008 | Araki et al. |
| 2008/0165437 A1 | 7/2008 | Didomenico |
| 2008/0184989 A1 | 8/2008 | Mecham |
| 2008/0223443 A1 | 9/2008 | Benitez et al. |
| 2008/0257408 A1 | 10/2008 | Chen et al. |
| 2008/0264486 A1 | 10/2008 | Chen et al. |
| 2008/0271776 A1 | 11/2008 | Morgan |
| 2009/0064993 A1 | 3/2009 | Ghosh et al. |
| 2009/0067784 A1 | 3/2009 | Ghosh et al. |
| 2009/0126792 A1 | 5/2009 | Gruhlke et al. |
| 2009/0167651 A1 | 7/2009 | Minano et al. |
| 2009/0314329 A1 | 12/2009 | Saha |
| 2009/0314347 A1 | 12/2009 | Kleinwaechter |
| 2009/0316074 A1 | 12/2009 | Tomiyoshi |
| 2010/0024868 A1 | 2/2010 | Baruchi et al. |
| 2010/0037954 A1 | 2/2010 | Thony |
| 2010/0065120 A1 | 3/2010 | McDonald |
| 2010/0103681 A1 | 4/2010 | Kamei et al. |
| 2010/0108124 A1 | 5/2010 | Knox et al. |
| 2010/0116319 A1 | 5/2010 | Martinez Anton et al. |
| 2010/0116336 A1 | 5/2010 | Martinez Anton et al. |
| 2010/0165495 A1 | 7/2010 | Murtha |
| 2010/0271839 A1 | 10/2010 | Chan et al. |
| 2010/0278480 A1 | 11/2010 | Vasylyev |
| 2011/0011449 A1 | 1/2011 | Morgan |
| 2011/0096426 A1 | 4/2011 | Ghosh et al. |
| 2011/0096570 A1 | 4/2011 | Vissenberg et al. |
| 2011/0176325 A1 | 7/2011 | Sherman et al. |
| 2011/0217013 A1 | 9/2011 | Moore et al. |
| 2011/0226332 A1* | 9/2011 | Ford et al. ............ 136/259 |
| 2011/0228562 A1 | 9/2011 | Travis et al. |

(56) References Cited

U.S. PATENT DOCUMENTS

| | | | |
|---|---|---|---|
| 2012/0063166 A1 | 3/2012 | Panagotacos et al. | |
| 2012/0080508 A1 | 4/2012 | Schultz et al. | |

FOREIGN PATENT DOCUMENTS

| | | |
|---|---|---|
| EP | 2061093 A1 | 5/2009 |
| EP | 2077586 A1 | 7/2009 |
| ES | P200803237 | 11/2008 |
| FR | 2872256 A1 | 12/2005 |
| GB | 1570684 A | 7/1980 |
| JP | 2001289515 A | 10/2001 |
| JP | 2003258291 A | 9/2003 |
| JP | 2005019587 A | 1/2005 |
| JP | 2005123036 A | 5/2005 |
| WO | 98/26212 A1 | 6/1998 |
| WO | 9826212 A1 | 6/1998 |
| WO | 0244766 A2 | 6/2002 |
| WO | 2004/088724 A2 | 10/2004 |
| WO | 2004114418 A1 | 12/2004 |
| WO | 2006010249 A1 | 2/2006 |
| WO | 2006064365 A2 | 6/2006 |
| WO | 2006088369 A2 | 8/2006 |
| WO | 2007014371 A2 | 2/2007 |
| WO | 2007045917 A2 | 4/2007 |
| WO | 2008001277 A2 | 1/2008 |
| WO | 2008058245 A2 | 5/2008 |
| WO | 2008092679 A1 | 8/2008 |
| WO | 2008103987 A2 | 8/2008 |
| WO | 2008/131561 A1 | 11/2008 |
| WO | 2009001106 A2 | 12/2008 |
| WO | 2009035986 A2 | 3/2009 |
| WO | 2009041330 A1 | 4/2009 |
| WO | 2009058619 A2 | 5/2009 |
| WO | 2009063416 A2 | 5/2009 |
| WO | 2009064701 A1 | 5/2009 |
| WO | 2009086293 A2 | 7/2009 |
| WO | 2010005655 A2 | 1/2010 |
| WO | 2010033859 A2 | 3/2010 |
| WO | 2010040053 A1 | 4/2010 |
| WO | 2011065975 A1 | 6/2011 |

OTHER PUBLICATIONS

International Search Report of PCT/CA2008/000847; Aug. 13, 2008; Malgorzata Samborski.

Document "Chapter 2: Holographic Methods". (dated prior to Oct. 15, 2010) (Illumination Parent Non-Patent Literature, pp. 116-125).
The William L. Bonnell Company, "Extrusion Process Description". (dated prior to Oct. 15, 2010) (Illumination Parent Non-Patent Literature, pp. 108-115).
"Plastic and Their Properties" (dated prior to Oct. 15, 2010) (Illumination Parent Non-Patent Literature, pp. 99-107).
"High Reflectors" (dated prior to Oct. 15, 2010) (Illumination Parent Non-Patent Literature, pp. 92-98).
"Plexiglas Acrylic Molding Resin", 2008, Altuglas International (Illumination Parent Non-Patent Literature, pp. 24-91).
JDSU "Thin Film Custom Optics", Dec. 2007. (Illumination Parent Non-Patent Literature, pp. 16-23).
"Meisner Acrylic Casting". (dated prior to Oct. 15, 2010) (Illumination Parent Non-Patent Literature, pp. 14-15).
English Abstract of FR2872256, Dec. 30, 2005 (Undated Patent References, p. 1).
English Abstract of JP2001289515, Oct. 19, 2001 (Undated Patent References, p. 2).
English Abstract of JP2003258291, Sep. 12, 2003 (Undated Patent References, p. 3).
English Abstract of JP2005019587, Jan. 20, 2005 (Undated Patent References, p. 4).
English Abstract of JP2005123036, May 12, 2005 (Undated Patent References, p. 5).
English Abstract of EP1895228. Mar. 5, 2008 (Undated Patent References, p. 6).
English Abstract of DE19937448, Feb. 8, 2001 (Undated Patent References, p. 7).
Benitez et al., "High Performance Fresnel-based Photovoltaic Concentrator", Apr. 26, 2010, Optical Society of America, vol. 18, No. S1. (Illumination Parent Non-Patent Literature pp. 154-169).
Winston et al., "Planar Concentrations Near the Etendue Limit", Oct. 1, 2005, Optical Society of America, vol. 30, No. 19. (Illumination Parent Non-Patent Literature pp. 128-130).
Chaves et al.: "Ideal Concentrators with Gaps", Mar. 1, 2002, Applied Optics, vol. 41, No. 7, pp. 1267-1276. (Illumination Parent Non-Patent Literature pp. 144-153).
Chaves et al.: "Ultra Flat Ideal Concentrators of High Concentration", 2000, Solar Energy, vol. 69, No. 4, pp. 269-281. (Illumination Parent Non-Patent Literature pp. 131-143).
Ghosh et al.: "A New Approach to Concentrating and Aggregating Light Energy", Jun. 2007. (Illumination Parent Non-Patent Literature pp. 126-127).

* cited by examiner

LIGHT-GUIDE SOLAR ENERGY CONCENTRATOR

FIELD OF THE INVENTION

The present invention relates to solar concentrators.

BACKGROUND

One way to harvest solar energy is to use concentrated solar power systems such as concentrated photovoltaic systems that employ optical components to concentrate solar energy onto photovoltaic cells. Compact optical systems and components for concentrating solar energy have been developed over the years. Some of these designs comprise a two-stage solar concentrator or collector in which a light focusing layer is optically coupled to a light redirecting layer. The redirecting layer includes a waveguide that guides the sunlight laterally within the waveguide towards a solar collector by total internal reflections with almost no loss of energy. In these types of solar concentrators, light is transferred from the focusing layer to the redirecting layer through very small optical apertures; therefore high precision is required in the assembly of each concentrator.

There is a need to further improve these two-stage solar concentrators to make them more energy efficient and to simplify manufacturing.

SUMMARY

A light-guide solar energy concentrator is therefore provided that has a light-condensing layer which focuses and collimates the light, and an optical waveguide layer which receives the collimated light and guides the light toward a light collection area.

Additional and alternative features, aspects, and advantages of the embodiments described herein will become apparent from the following description, the accompanying drawings, and the appended claims.

BRIEF DESCRIPTION OF THE DRAWINGS

For a better understanding of the present invention, as well as other aspects and further features thereof, reference is made to the following description which is to be used in conjunction with the accompanying drawings, where.

DETAILED DESCRIPTION

The embodiments described herein provide an apparatus and method for concentrating sunlight. In one embodiment there is provided a light-guide solar concentrator comprising: a light-condensing layer comprising a focusing surface comprising a plurality of focusing optical elements, each focusing optical element adapted for receiving and focusing sunlight incident thereon, and a plurality of collimating optical elements, each collimating optical element adapted for receiving the focused sunlight from a corresponding focusing optical element and collimating the focused sunlight; and an optical waveguide layer spaced apart from and optically coupled to the light-condensing layer, the optical waveguide layer having a top surface, a bottom surface and an optical exit surface, the bottom surface comprising a plurality of deflectors, each deflector having a deflecting surface for receiving light from a corresponding one of the plurality of collimating optical elements and redirecting the light toward the optical exit surface of the optical waveguide layer, and a plurality of bottom reflecting elements between each of the deflectors, and the top surface comprising one or more top reflecting elements, the one or more top reflecting elements and the plurality of bottom reflecting elements for guiding the light therebetween toward the optical exit surface.

In further aspects of this embodiment, the top surface comprises a plurality of distinct entry facets, each entry facet for receiving the substantially collimated light from a corresponding one of the plurality of collimating optical elements and transmitting the light to the corresponding one of the plurality of deflectors; the entry facet is a concave lens; the focusing optical elements and the collimating optical elements are concave lenses; the optical waveguide layer is wedge-shaped; the deflecting surfaces, the plurality of bottom reflecting elements and the one or more top reflecting elements directs light by total internal reflection; the one or more top reflecting elements are substantially parallel to the plane of the light-condensing layer; the bottom reflective elements are arranged in stepped relation to one another; the light-guide solar concentrator comprises more than one top reflecting element; the top reflecting elements are arranged in stepped relation with one another; the light-guide solar concentrator comprises a secondary optic having an optical output surface and at least one reflective surface, the at least one reflective surface being optically coupled to the waveguide layer via the optical exit surface to receive light therefrom and redirect the light toward the optical output surface; the at least one reflective surface of the secondary optic is shaped to further concentrate the sunlight; the secondary optic is integrally formed with the waveguide layer; the light-guide solar concentrator has a revolved geometry wherein the plurality of focusing elements form concentric rings about an optical axis and the plurality of collimating optical elements form concentric rings about the optical axis and wherein the optical exit surface of the waveguide layer is centrally located; the light-guide solar concentrator comprises a secondary optic having an optical output surface and at least one reflective surface, the at least one reflective surface being optically coupled to the waveguide layer via the optical exit surface to receive light therefrom and to concentrate and redirect the light toward the optical output surface; the optical output surface is centrally located at the bottom of the light-guide solar concentrator; the light-condensing layer further comprises a plurality of first reflecting surfaces, each of the first reflecting surfaces for receiving focused light from a corresponding one of the plurality of focusing optical elements and redirecting the light toward the corresponding collimating optical element, and wherein the optical waveguide layer further comprises a plurality of second reflecting surfaces, each of the second reflecting surfaces for receiving the substantially collimated light from the corresponding collimating optical element and redirecting the light toward the corresponding deflector; one or more of the plurality of second reflecting surfaces is a curved reflecting surface; the light-condensing layer comprises a main body and at least one of (i) one or more first reflecting surfaces and (ii) one or more of the collimating elements extends from the main body of the light-condensing layer and is in physical contact with the top surface of the optical waveguide layer and wherein the main body of the light-condensing layer is spaced apart from the waveguide layer; and/or the light-guide solar concentrator comprises a secondary optic having an optical output surface and a reflective surface, the reflective surface being optically coupled to the waveguide layer via the optical exit surface to receive light therefrom and redirect the light toward the optical output surface.

In another embodiment, there is provided a method of concentrating sunlight comprising: receiving sunlight incident on a light-condensing layer; focusing the received sunlight in the light-condensing layer; collimating the focused sunlight for output from the light-condensing layer; receiving the collimated sunlight in a waveguide layer optically coupled to the light-condensing layer; and redirecting the light received by the waveguide layer toward an optical exit surface of the waveguide layer.

In further aspects of the latter embodiment, the light-condensing layer comprises a plurality of focusing optical elements for focusing the received sunlight; the light-condensing layer comprises a plurality of collimating optical elements for collimating the focused sunlight; and the waveguide layer comprises a plurality of deflectors and one or more reflecting surfaces for redirecting the light received by the waveguide layer, each deflector having a deflecting surface.

Embodiments of the present invention may have one or more of the above-mentioned aspects, but do not necessarily comprise all of the above-mentioned aspects or objects described herein, whether express or implied. It will be understood by those skilled in the art that some aspects of the embodiments described herein may have resulted from attempting to attain objects implicitly or expressly described herein, but may not satisfy these express or implied objects, and may instead attain objects not specifically recited or implied herein.

Figure 1A:
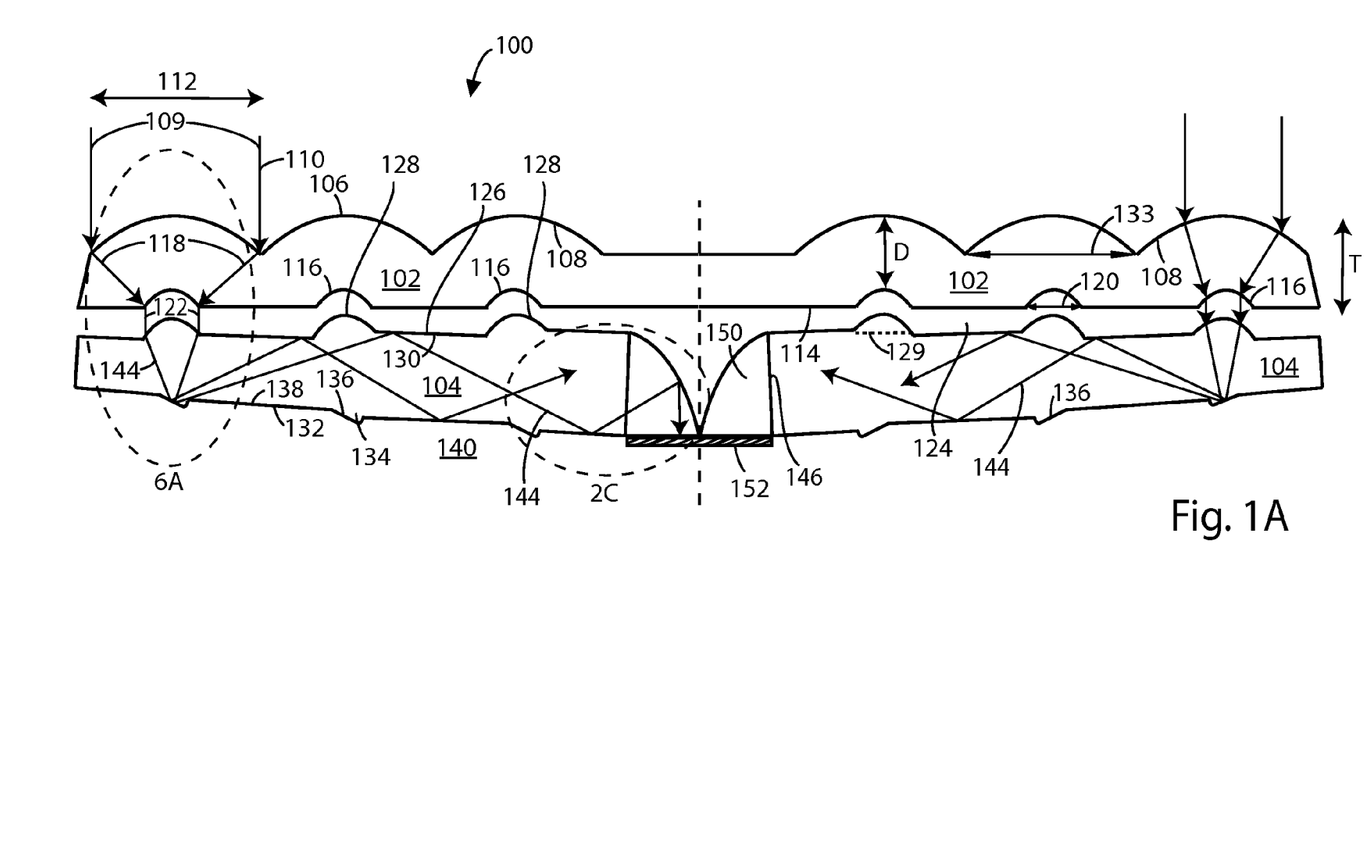
FIG. 1A is a cross-sectional view of a first embodiment of a light-guide solar energy concentrator.

As illustrated in FIG. 1A, a light-guide solar concentrator 100 has a light-condensing layer 102 and an optical waveguide layer 104, each of which can be made of any suitable light transmissive material, such as a polymer or glass. For example, injection molded Poly(methyl methacrylate) (PMMA) having a refractive index of about 1.49 for the visible part of the optical spectrum can be used.

The light-condensing layer 102 includes a focusing surface 106 that has a plurality of focusing optical elements 108 for receiving and focusing sunlight 110 incident thereon. As the light-guide solar concentrator 100 is intended for use in solar tracking systems, the sunlight 110 is substantially collimated and perpendicular to the plane of the light-condensing layer 102. Each of the focusing optical elements 108 has a width 133. For the purposes of this application, an incoming sunlight beam 109 is defined to be the sunlight 110 incident on a focusing optical element 108. An incoming sunlight beam 109 therefore has a width 112 that is, at most, equal to the width 133 of the focusing optical element 108 upon which it impinges.

The light-condensing layer 102 further includes a collimating surface 114 that has a plurality of collimating optical elements 116. Each collimating optical element 116 receives a focused sunlight beam 118 from a corresponding focusing optical element 108. The collimating optical elements 116 are located at a distance D from the corresponding focusing optical elements 108 such that the width of each of the focused sunlight beams 118 received by the collimating optical element is smaller than the width 112 of its corresponding incoming sunlight beam 109. To reduce the thickness T of the light-condensing layer 102 and thereby reduce the optically transmissive material required to make the light-condensing layer 102 while maintaining optical efficiency, the distance D can be selected such that the focused sunlight beams 118 have widths equal to the widths 120 of the collimating optical elements 116 when they impinge upon the collimating optical elements 116 such that the entire surface of the collimating optical element 116 receives focused sunlight.

Each collimating optical element 116 collimates the focused sunlight beam 118 received from the corresponding focusing optical element 108. The substantially collimated light beam 122 is condensed or concentrated in relation to the incoming sunlight beam 109 where the width 121 of the collimated light beam 122 is smaller than the width 112 of the incoming sunlight beam 109 and the intensity of the collimated light beam 122 is higher than the incoming sunlight beam 109.

In the embodiment illustrated in FIG. 1A, the focusing elements 108 and collimating elements 116 are convex lenses; however, the focusing elements 108 and collimating elements 116 can be of any other suitable shape.

As shown in FIG. 1A, the combined effect of a focusing element 108 and a collimating element 116 is to create a substantially collimated and condensed beam of sunlight 122. Thus, when exposed to sunlight 110, the light-condensing layer 102 delivers a plurality of collimated and condensed beams of sunlight 122.

The concentration achieved by the light-condensing layer 102 is given by the ratio of the sum of the widths 112 of the incoming sunlight beams 109 across the plurality of focusing elements to the sum of the widths 121 (shown in FIG. 6A) of the collimated light beam 122. Greater concentration can be achieved by increasing the separation distance D between the focusing optical elements 108 and the collimating optical elements 116 to narrow the collimated light beam 122. However, the greater the separation distance D, the thicker the light-condensing layer 102 will be and the higher the cost of manufacturing the light-guide solar concentrator 100. Therefore, there is a trade-off between having a thin light-condensing layer 102 and achieving a high concentration factor in the light-condensing layer 102.

The optical waveguide layer 104 is positioned with respect to the light-condensing layer 102 so that the optical waveguide layer 104 is optically coupled to the light-condensing layer 102. The waveguide layer 104 can be physically spaced apart from the light-condensing layer 102 by a vertical gap 124. The vertical gap 124 is filled by air, silicone or any other suitable optical encapsulant, bonding or cladding material that allows light 144 to be guided within the optical waveguide layer 104.

The waveguide layer 104 has a top surface 126 comprising a plurality of entry facets 128 and a plurality of top reflecting elements 130. The waveguide layer 104 also has a bottom surface 132 opposite the top surface 126, comprising a plurality of deflectors 134 and a plurality of bottom reflecting elements 138.

Figure 1B:
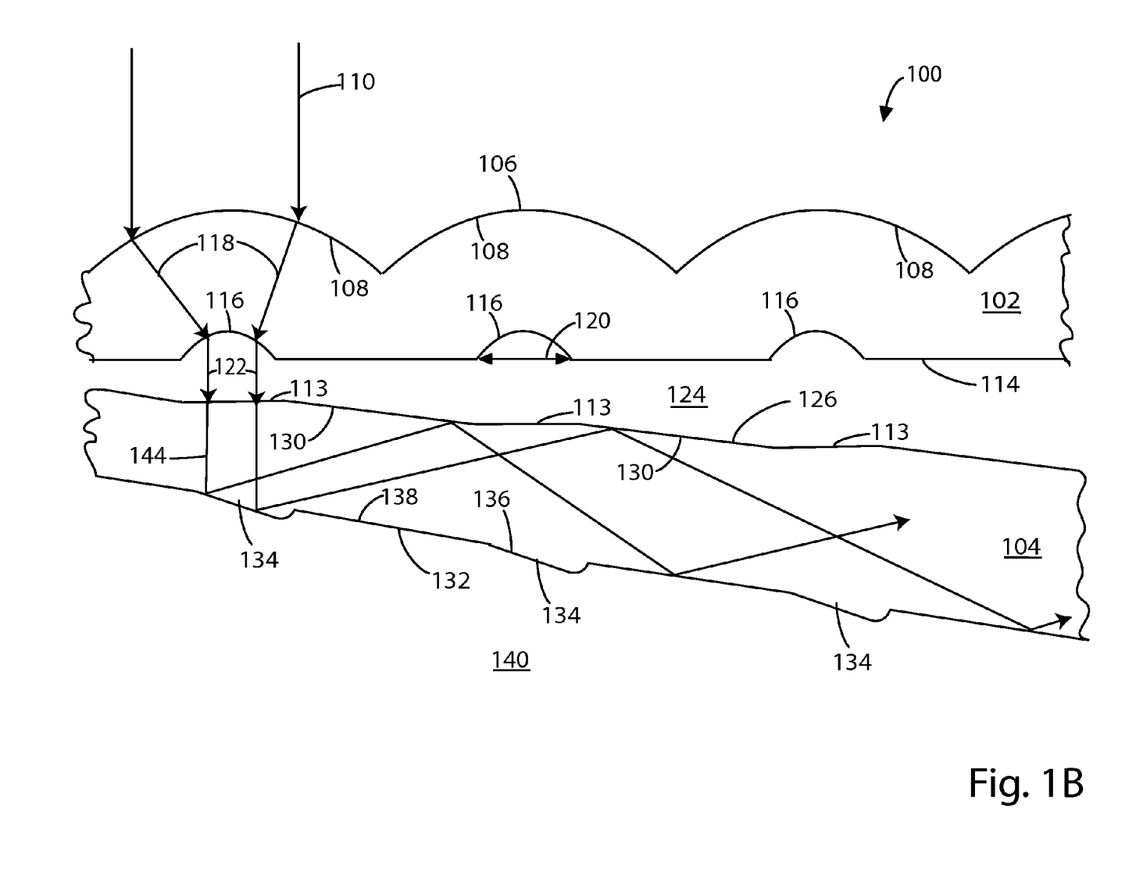
FIG. 1B is a cross-sectional view of a portion of a second embodiment of a light-guide solar energy concentrator.

Each entry facet 128 of the waveguide layer 104 corresponds with a collimating optical element 116 and receives a collimated light beam 122 therefrom. Each entry facet 128 can be shaped to focus the collimated light beam 122 onto one of the deflectors 134. For example, as shown in FIG. 1A, the entry facets 128 can be convex lenses. Alternatively, as shown in FIG. 1B, the entry facets 113 can be flat and need not provide additional concentration.

The deflectors 134 have a deflecting surface 136 positioned at an angle with respect to the focused sunlight 144 received from the entry facets 128 and the bottom reflecting elements 138 so as to redirect this sunlight 144 laterally into the waveguide layer 104 to be guided thereby toward an optical exit surface 146. The sunlight 144 can be guided within the waveguide layer 104 by total internal reflections. Once the sunlight 144 is totally internally reflected at the plurality of deflectors 134, it propagates in the waveguide layer 104 towards the plurality of top reflecting elements 130. Light continues to travel within the waveguide via multiple total internal reflections on the top reflecting elements 130 and the bottom reflecting elements 138.

The orientation of the top reflecting elements 130 with respect to the deflecting surfaces 136, the orientation of the bottom reflecting elements 138 with respect to the top reflecting elements 130 and the ratio of the refractive index of the optically transmissive material of the optical waveguide layer 104 to the refractive index of the material filling the vertical gap 124 and the material 140 to which the bottom surface 132 is exposed can be chosen such that sunlight 144 impinging on the deflecting surfaces 136, top reflecting elements 130 and bottom reflecting elements 138 undergoes total internal reflection.

While the embodiment illustrated in FIG. 1A has deflecting surfaces 136, top reflecting elements 130 and bottom reflecting elements 138 that are planar, they can have any suitable shape that provides the conditions for total internal reflection. The function of the deflecting surface 136, top reflecting element 130 and bottom reflecting element 138 need not be based on total internal reflection and can alternatively be based on other forms of reflection such as can be provided by a suitable type of mirror.

In the embodiment illustrated in FIG. 1A, the top reflecting elements 130 lie at an angle with respect to the horizontal plane of the light-condensing layer 102. Alternatively, the top reflecting elements 130 can be parallel to the horizontal plane of the light-condensing layer 102. Each entry facet 128 is oriented so that its base 129 is substantially parallel to the horizontal plane of the light-condensing layer 102. The top surface 126 of the waveguide layer 104, comprising the entry facets 128 and the top reflecting elements 130, can be stepped. The bottom surface 132 of the waveguide layer 104, comprising the deflectors 134 and the bottom reflecting elements 138 can also be stepped. As shown in FIG. 1A, the waveguide layer 104 can be wedge-shaped and can act to propagate or guide the sunlight 144 toward the wider end of the wedge, which direction is called the downstream direction. Optionally, the top reflecting elements 130 can lie parallel to the bottom reflecting elements 138.

Figure 1C:
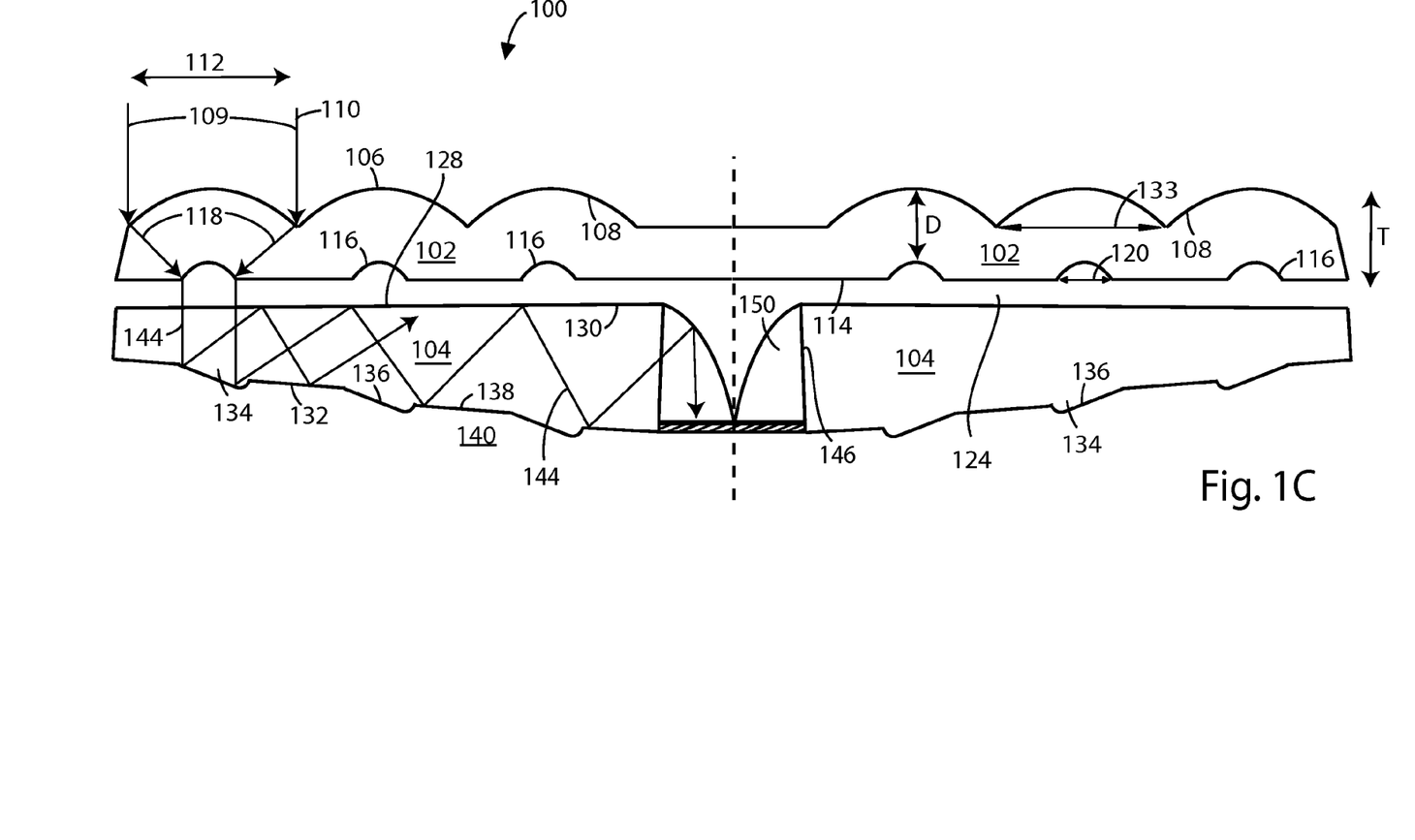
FIG. 1C is a cross-sectional view of a third embodiment of a light-guide solar energy concentrator.

While the embodiments described above comprise distinct entry facets 128, the top surface 126 can also be a flat or planar surface such that the entry facets 128 and the top reflecting elements 130 are co-planar and have no discontinuity between them (as shown in FIG. 1C). The angle of the planar surface relative to the plane of the light-condensing layer 102 should be sufficiently shallow to allow substantially all of light of the collimated light beam 122 to pass through the top surface 126. The angles between the deflecting surfaces 136 the planar top surface 126 and the bottom reflecting elements 138 are chosen to allow the light 144 to be guided within the waveguide layer 104 toward the optical exit surface 146.

The configuration of the waveguide layer 104 illustrated in FIG. 1A allows for total internal reflection conditions in which very little, if any, light 144 travelling within the waveguide layer 104 escapes via the entry facets 128. After successive total internal reflections at the top reflecting elements 130 and the bottom reflecting elements 138 of the waveguide layer 104, the sunlight 144 exits the optical waveguide layer 104 through an optical exit surface 146 and into a light collection area 158 where a solar energy collector (or SEC) 152, such as a photovoltaic (PV) cell, can be placed to harvest the energy of the sunlight 144.

Figure 2A:
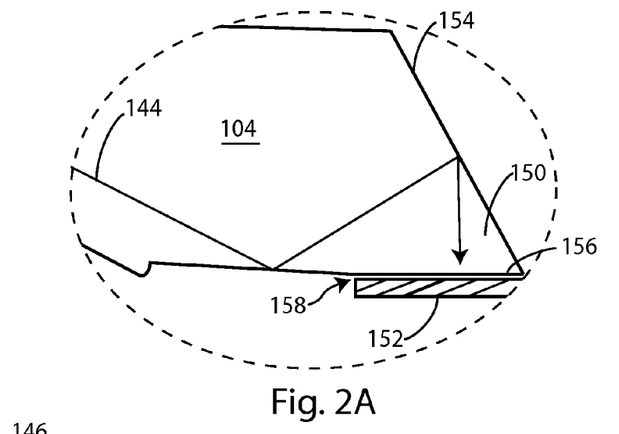
FIG. 2A is a cross-sectional view of a first embodiment of a secondary optic that can be used in a light-guide solar energy concentrator.
Figure 2B:
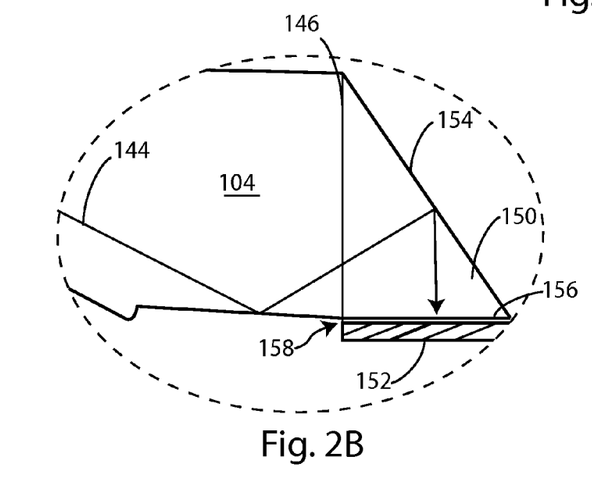
FIG. 2B is a cross-sectional view of a second embodiment of the secondary optic that can be used in a light-guide solar energy concentrator.
Figure 2C:
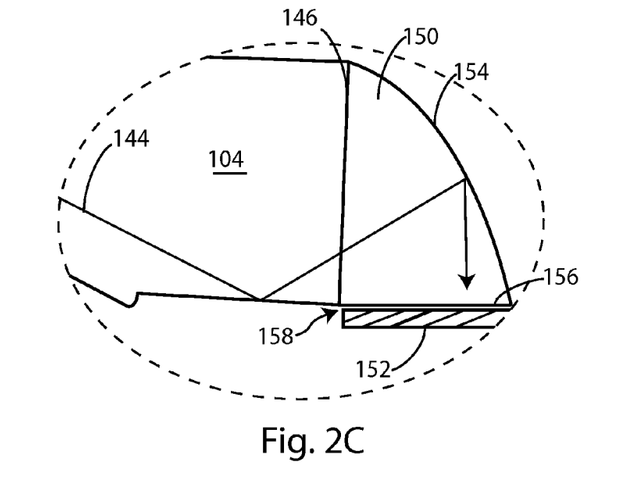
FIG. 2C is a detailed view of portion 2C of a light-guide solar energy concentrator of FIG. 1A.

FIGS. 2A-2C show three exemplary embodiments of the downstream portion of the light-guide solar concentrator 100 (outlined in FIG. 1A as 2C). As shown in FIGS. 2A-2C, a secondary optic 150 can be used to optically couple the waveguide 104 to the SEC 152.

In the embodiment of FIG. 2A, the secondary optic 150 is integrally formed with the waveguide layer 104. The secondary optic 150 has a reflective surface 154 to redirect light 144 toward an optical output surface 156. The light emitted from the optical output surface 156 may then enter a light collection area 158 situated proximate to the optical output surface 156 where an SEC 152 can be placed to harvest the light 144.

In the embodiment of FIG. 2B the secondary optic 150 is a separate optical element that is optically coupled to the waveguide layer 104 at exit surface 146. The secondary optic 150 has a reflective surface 154 to redirect the light 144 towards an optical output surface 156 where an SEC 152 is placed.

In the embodiment of FIG. 2C the secondary optic 150 is a separate optical element from the waveguide layer 104, is optically coupled at the exit surface 146, and has a curved reflective surface 154 designed to redirect and concentrate light 144 onto an SEC 152. The secondary optic 150 can have a variety of shapes and can have one or more reflective surfaces, which reflects light via total internal reflection or by means of a reflective surface such as a mirror. The secondary optic 150 can either be integrally formed with the waveguide 104 or can be a separate optical element, and can do one of the following: redirect light toward the optical output surface 156, concentrate light onto the optical output surface 156, or both redirect and concentrate light onto the optical output surface 156.

Figure 3:
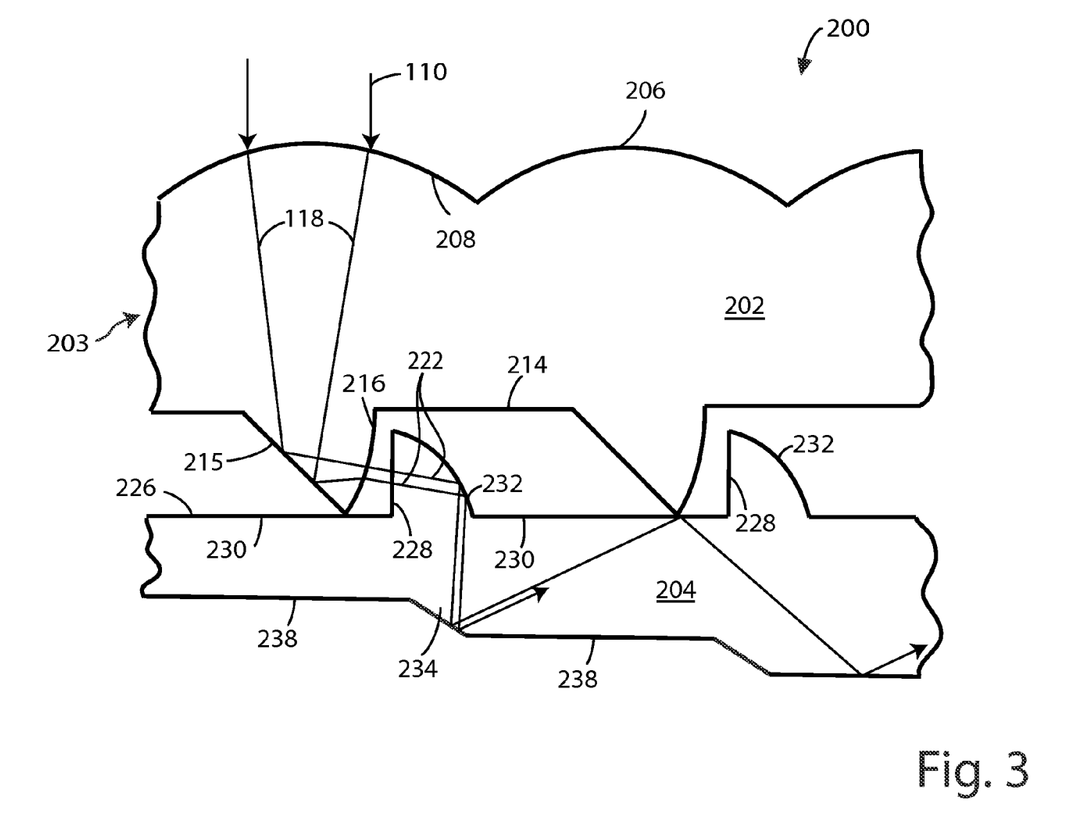
FIG. 3 is a cross-sectional view of a portion of a fourth embodiment of a light-guide solar energy concentrator.

FIG. 3 shows a portion of another embodiment of a light-guide solar concentrator 200. The light-condensing layer 202 includes a focusing surface 206 that has a plurality of focusing optical elements 208 for receiving and focusing normal incident sunlight 110. The collimating surface 214 of the light-condensing layer 202 includes a reflecting surface 215 to redirect light to a collimating element 216, which outputs a collimated light beam 222 at an angle with respect to the incident sunlight 110. The optical entry facet 228 of the waveguide layer 204 is oriented to receive the collimated light beam 222. The top surface 226 of the waveguide layer 204 further includes a curved reflecting surface 232 to redirect the collimated light beam 222 to the deflectors 234. Having undergone a total internal reflection at the deflectors 234, the light propagates laterally through the waveguide layer 204 via a series of total internal reflections between the top reflecting elements 230 and the bottom reflecting elements 238. In embodiments where the reflecting surface 215 and/or the collimating elements 216 extend from the main body 203 of the light-condensing layer 202, one or more of the reflecting surfaces 215 and/or the collimating elements 216 can, but need not, be in physical contact with the top surface 226 of the optical waveguide layer 204 while the main body 203 of the light-condensing layer 202 is spaced apart from the waveguide layer 204. The surface area of the top surface 226 in contact with the collimating elements 216 is relatively small so as to minimize any interference with the reflective properties of the top surface 226 of the waveguide layer 204. Such collimating elements 216 may facilitate alignment of the light-condensing layer 202 with the waveguide layer 204.

Figure 4:
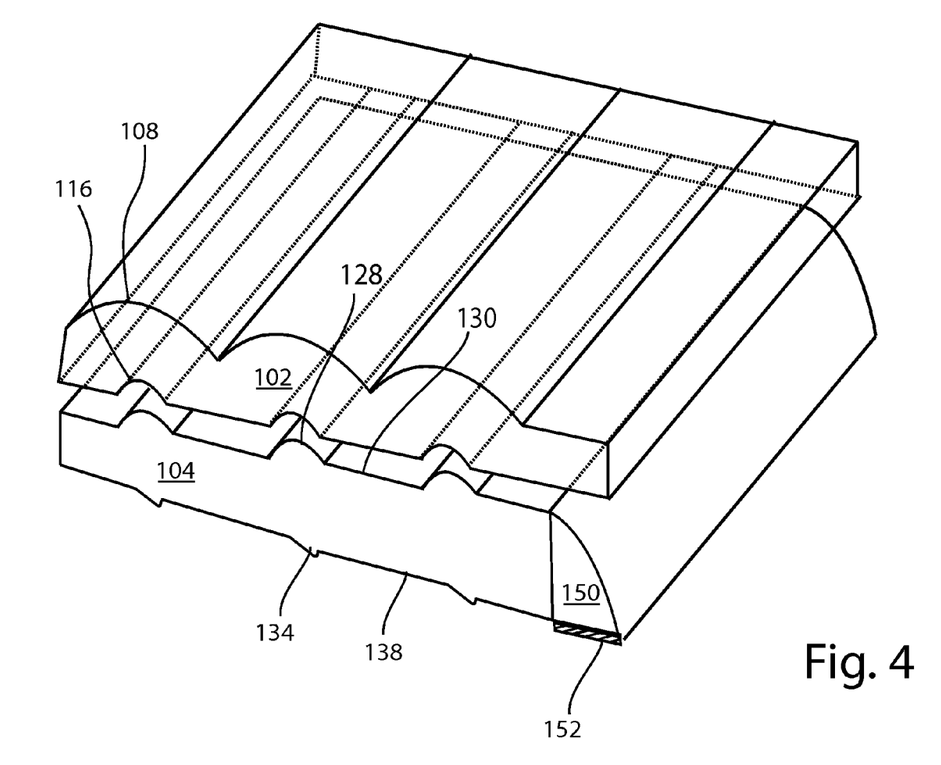
FIG. 4 is an isometric view of a light-guide solar energy concentrator that has a linear geometry.

In any of the above embodiments, the light-condensing layer 102, 202 can be formed in a first slab of optically transmissive material and the optical waveguide layer 104, 204 can be formed in a second slab of optically transmissive material. As an example, each of the first and second slabs can be injection molded out of PMMA. The two slabs are optically coupled and are spaced apart from each other by a gap filled with air, silicone or any other suitable optical encapsulant or cladding material. Each of the light-condensing layer 102, 202 and the waveguide layer 104, 204 can be longitudinal extrusions such that the light-condensing layer 102 and the waveguide layer 104 are generally rectangular, as shown in FIG. 4.

Figure 5:
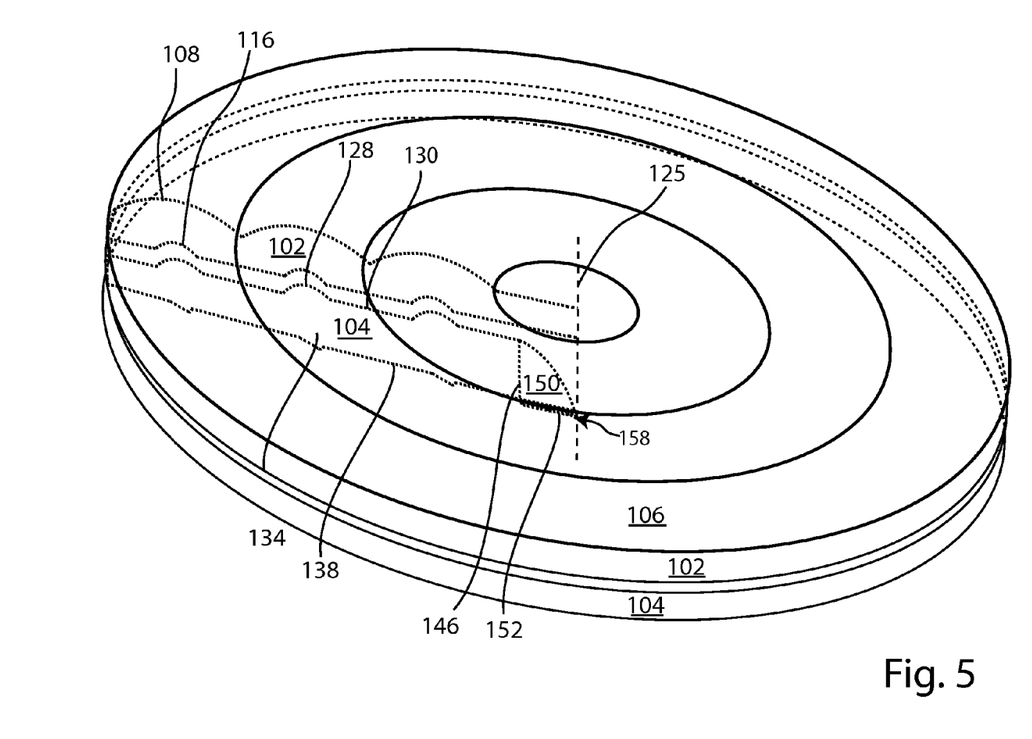
FIG. 5 is an isometric view of a light-guide solar energy concentrator have a revolved geometry.

In another embodiment, the light-guide solar concentrator 100, 200 can have a revolved geometry. FIG. 5 shows a light-guide solar concentrator 100 that has the cross-section shown in FIG. 1A. In this embodiment, the light-condensing layer 102 comprises a plurality of focusing elements 108 concentrically disposed in an abutting side-by-side relationship, and a plurality of collimating elements 116 concentrically disposed, but separated from one another. The focusing elements 108 and collimating elements 116 are each cylindrical lenses forming concentric rings about the optical axis 125 of the light-guide solar concentrator 100. In this embodiment, the waveguide layer 104 is disk-shaped, is substantially the same size as the light-condensing layer 102 and has a centrally located exit surface 146. The plurality of deflectors 134 consist of annular wedges disposed concentrically about the optical axis 125. The deflectors 134 are spaced apart from each other by bottom reflecting elements 138, which also form rings about the optical axis 125. As round light-guide solar concentrators 100 can be difficult to arrange in a solar panel module, round light-condensing layers 102 and round optical waveguide layers 104 can be cropped to make the light-guide solar concentrator 100 a tileable shape, such as square or hexagonal.

Where the light-guide solar concentrator 100 has a revolved geometry, the secondary optic 150 also has a revolved geometry. The secondary optic 150 receives light 144 propagating toward the optical axis 125 of the waveguide layer 104 and directs the light 144 toward a light collection area 158 where a solar energy collector 152, such as a photovoltaic cell, can be placed to harvest the solar energy. The solar energy collector 152 can be located on the bottom surface of the light-guide solar concentrator at the optical axis 125. The active face of the photovoltaic cell generally lies parallel to the plane of the light-condensing layer 102 and perpendicular to the incident normal sunlight 110 to receive the light 144 directed thereto by the secondary optic 150.

Figure 6A:
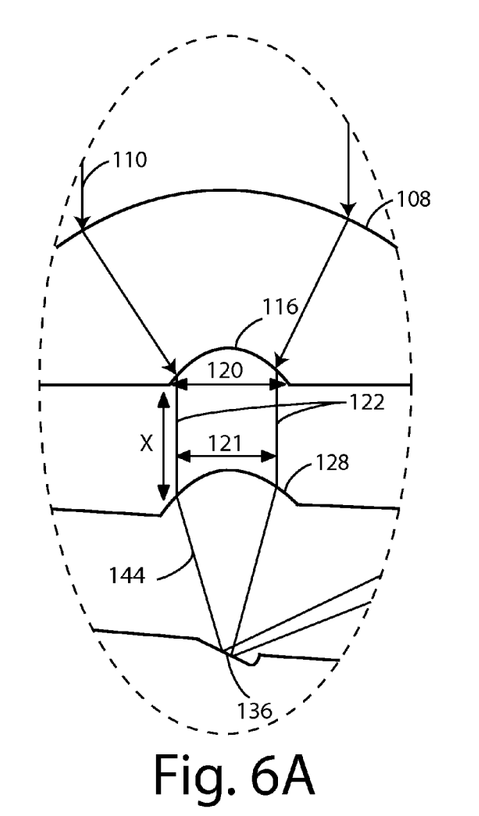
FIG. 6A is a detailed view of portion 6A of FIG. 1A, where the light-condensing layer and waveguide layer are separated by a distance X.
Figure 6B:
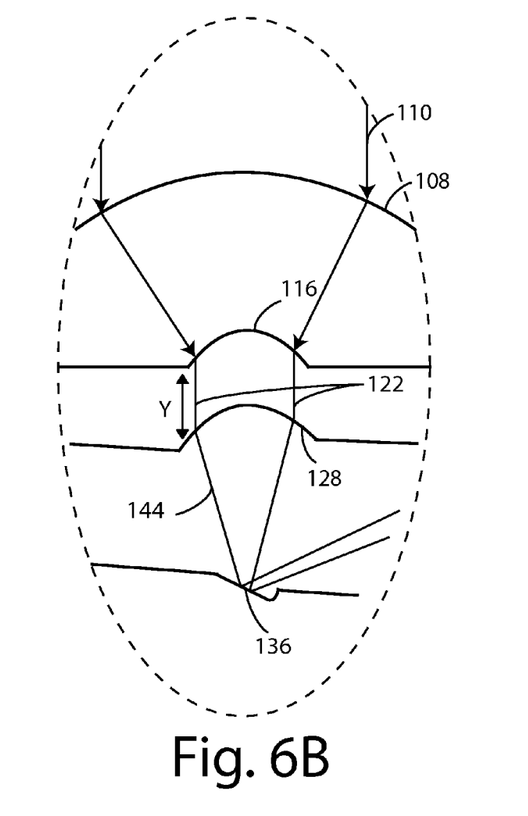
FIG. 6B is a detailed view of portion 6A of FIG. 1A, where the light-condensing layer and waveguide layer are separated by a distance Y that is shorter than X.

Light is concentrated and then collimated to eliminate the need for small optical apertures to couple the light-condensing layer 102 and optical waveguide layer 104 and to eliminate the need for high precision alignment. The performance of the light-guide solar concentrator 100 of FIG. 1A is substantially invariant to changes in the vertical positioning of the waveguide layer 104 with respect to the light-condensing layer 102. This invariance is shown at FIGS. 6A-6B, which are exploded views of the portion outlined in FIG. 1A. It is shown that the vertical spacing X in FIG. 6A is greater than the vertical spacing Y in FIG. 6B. Because the light-condensing layer 102 delivers beams of collimated light 122 to the optical waveguide layer 104, small deviations in the vertical alignment of the waveguide layer 104 with respect to the light-condensing layer 102 will not significantly affect the light coupling efficiency between the two layers.

Figure 7:
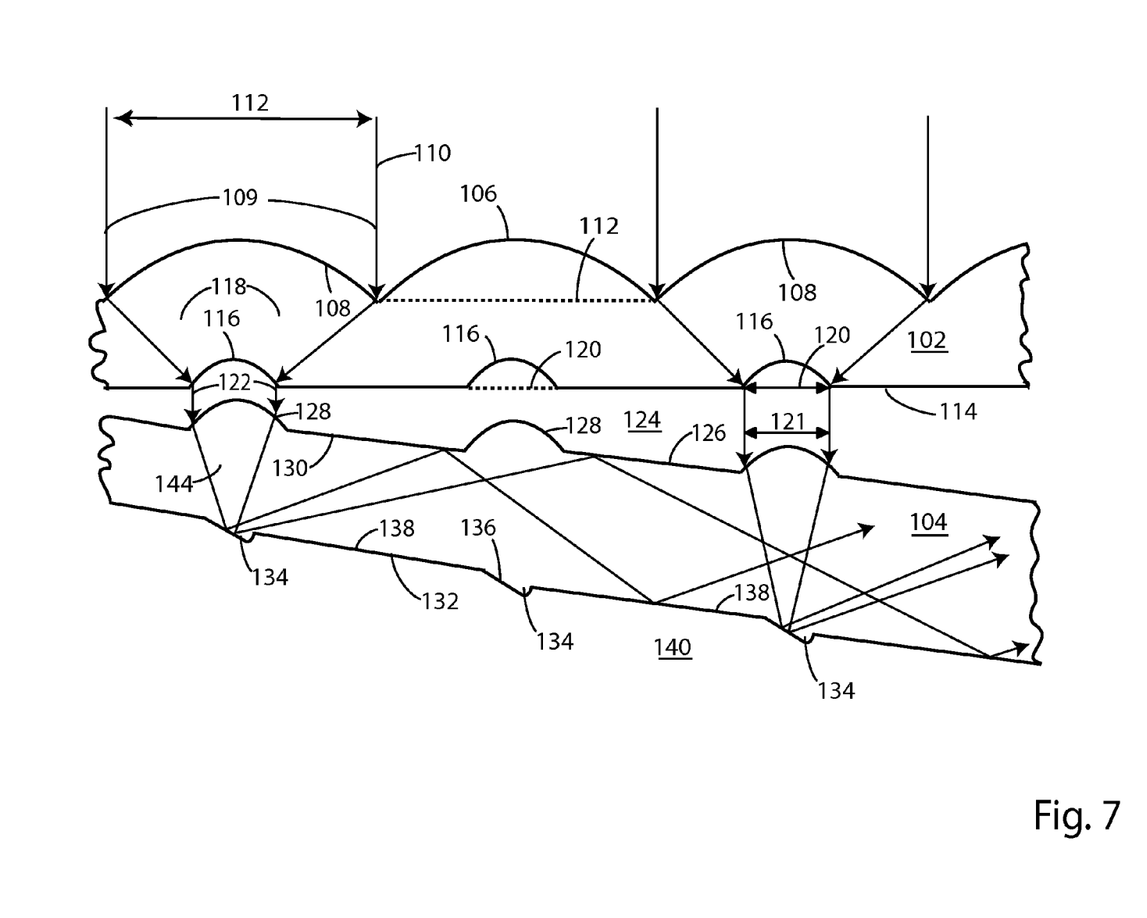
FIG. 7 is a cross-sectional view of the first embodiment of a light-guide solar energy concentrator where the optical waveguide layer is imperfectly aligned in the vertical direction with the light-condensing layer.

In the embodiment of FIG. 7, a portion of the light-guide solar concentrator 100 is shown, where the waveguide layer 104 is positioned at an angle with respect to the light-condensing layer 102, such that the entry facets 128 are at varying distances from the collimating optical elements 116. As illustrated, the distance and angular orientation of the collimating optical elements 116 with respect to the entry facets 128, do not have a significant effect on the transmission of light from the light-condensing layer 102 to the waveguide layer 104.

A solar concentrator 100, 200 can be assembled into a solar module for use in a solar panel. A solar module can have a light-condensing layer 102 of a solar concentrator 100, 200 held at a desired distance above and aligned with the waveguide layer 104 of that solar concentrator 100, 200 by a frame and/or spacer such that substantially all of the collimated light 122 is transmitted to the deflecting surfaces 136 and can have a solar energy collector 152 placed in the light collection area 158. As an example, the frame may have one or more grooves for securely holding the light-condensing layer 102 at the desired distance from the waveguide layer 104. The solar module can also have a tray to support the light condensing layer 102 and the waveguide layer 104 and to hold solar energy collector 152 at the light collection area 158. In some embodiments, the frame can be integrally formed with the tray or can be attached to the tray. An array of solar modules may be grouped to form a solar panel.

If with time, the light-condensing layer 102 and the waveguide layer 104 of a solar module were to become misaligned, for example due to thermal expansion or impact, at least a portion of the collimated beam 122 may still be transmitted from the condensing-layer to the waveguide layer. Concentrating and collimating the light as described can therefore allow greater manufacturing tolerances and thus require less precision in the assembly of the light-guide solar concentrator 100 than conventional two-stage solar concentrators, which reduces the cost of manufacturing. Similarly, a solar concentrator can be installed or repaired in the field without requiring the same tolerances of other solar energy concentrators.

Various embodiments of the present invention having been thus described in detail by way of example, it will be apparent to those skilled in the art that variations and modifications may be made without departing from the invention. The invention includes all such variations and modifications as fall within the scope of the appended claims.

What is claimed is:

1. A light-guide solar concentrator comprising:
   a light-condensing layer comprising:
      a focusing surface comprising a plurality of focusing optical elements, each focusing optical element adapted for receiving and focusing sunlight incident thereon; and
      a plurality of collimating optical elements, each collimating optical element adapted for receiving the focused sunlight from a corresponding focusing optical element and collimating the focused sunlight; and an optical waveguide layer spaced apart from and optically coupled to the light-condensing layer, the optical waveguide layer having a top surface, a bottom surface and an optical exit surface, the bottom surface comprising:
- a plurality of deflectors, each deflector having a deflecting surface for receiving light from a corresponding one of the plurality of collimating optical elements and redirecting the light toward the optical exit surface of the optical waveguide layer; and
- a plurality of bottom reflecting elements between each of the deflectors, and the top surface comprising a plurality of top reflecting elements, the one or more top reflecting elements and the plurality of bottom reflecting elements for guiding the light therebetween toward the optical exit surface.

2. The light-guide solar concentrator of claim 1 wherein the top surface comprises a plurality of distinct entry facets, each entry facet for receiving the substantially collimated light from a corresponding one of the plurality of collimating optical elements and transmitting the light to the corresponding one of the plurality of deflectors.

3. The light-guide solar concentrator of claim 2 wherein the entry facet is a concave lens.

4. The light-guide solar concentrator of claim 1 wherein the focusing optical elements and the collimating optical elements are concave lenses.

5. The light-guide solar concentrator of claim 1 wherein the optical waveguide layer is wedge-shaped.

6. The light-guide solar concentrator of claim 1 wherein the deflecting surfaces, the plurality of bottom reflecting elements and the one or more top reflecting elements directs light by total internal reflection.

7. The light-guide solar concentrator of claim 1 wherein the one or more top reflecting elements are substantially parallel to the plane of the light-condensing layer.

8. The light-guide solar concentrator of claim 1 wherein the bottom reflective elements are arranged in stepped relation to one another.

9. The light-guide solar concentrator of claim 8 comprising more than one top reflecting element and wherein the top reflecting elements are arranged in stepped relation with one another.

10. The light-guide solar concentrator of claim 1 further comprising a secondary optic having an optical output surface and at least one reflective surface, the at least one reflective surface being optically coupled to the waveguide layer via the optical exit surface to receive light therefrom and redirect the light toward the optical output surface.

11. The light-guide solar concentrator of claim 10 wherein the at least one reflective surface of the secondary optic is shaped to further concentrate the sunlight.

12. The light-guide solar concentrator of claim 10 wherein the secondary optic is integrally formed with the waveguide layer.

13. The light-guide solar concentrator of claim 1 having a revolved geometry wherein the plurality of focusing elements form concentric rings about an optical axis and the plurality of collimating optical elements form concentric rings about the optical axis and wherein the optical exit surface of the waveguide layer is centrally located.

14. The light-guide solar concentrator of claim 13 further comprising a secondary optic having an optical output surface and at least one reflective surface, the at least one reflective surface being optically coupled to the waveguide layer via the optical exit surface to receive light therefrom and to concentrate and redirect the light toward the optical output surface.

15. The light-guide solar concentrator of claim 14 wherein the optical output surface is centrally located at the bottom of the light-guide solar concentrator.

16. The light-guide solar concentrator of claim 1 wherein the light-condensing layer further comprises a plurality of first reflecting surfaces, each of the first reflecting surfaces for receiving focused light from a corresponding one of the plurality of focusing optical elements and redirecting the light toward the corresponding collimating optical element, and wherein the optical waveguide layer further comprises a plurality of second reflecting surfaces, each of the second reflecting surfaces for receiving the substantially collimated light from the corresponding collimating optical element and redirecting the light toward the corresponding deflector.

17. The light-guide solar concentrator of claim 16 wherein one or more of the plurality of second reflecting surfaces is a curved reflecting surface.

18. The light-guide solar concentrator of claim 16 wherein the light-condensing layer comprises a main body spaced apart from the waveguide layer and wherein at least one of (i) one or more first reflecting surfaces and (ii) one or more of the collimating elements extends from the main body of the light-condensing layer and is in physical contact with the top surface of the optical waveguide layer.

19. The light-guide solar concentrator of claim 16 further comprising a secondary optic having an optical output surface and a reflective surface, the reflective surface being optically coupled to the waveguide layer via the optical exit surface to receive light therefrom and redirect the light toward the optical output surface.

* * * * *